United States Patent
Lee et al.

(10) Patent No.: US 9,263,592 B2
(45) Date of Patent: Feb. 16, 2016

(54) OXIDE TRANSISTOR WITH NANO-LAYERED STRUCTURE

(71) Applicant: Electronics and Telecommunications Research Institute, Daejeon (KR)

(72) Inventors: Su Jae Lee, Daejeon (KR); Chi-Sun Hwang, Daejeon (KR); Hye Yong Chu, Daejeon (KR); Sang Chul Lim, Daejeon (KR); Jae-Eun Pi, Gyeonggi-do (KR); Min Ki Ryu, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 1 day.

(21) Appl. No.: 14/020,498

(22) Filed: Sep. 6, 2013

(65) Prior Publication Data

US 2014/0159036 A1 Jun. 12, 2014

(30) Foreign Application Priority Data

Dec. 12, 2012 (KR) .................. 10-2012-0144276

(51) Int. Cl.
*H01L 29/786* (2006.01)
*H01L 29/66* (2006.01)
*H01L 21/02* (2006.01)

(52) U.S. Cl.
CPC ...... *H01L 29/7869* (2013.01); *H01L 29/66969* (2013.01); *H01L 21/02554* (2013.01); *H01L 21/02565* (2013.01); *H01L 21/02631* (2013.01); *H01L 29/78696* (2013.01)

(58) Field of Classification Search
CPC .............. H01L 29/7869; H01L 29/66969; H01L 21/02554; H01L 21/02565; H01L 29/78696; H01L 21/02631; H01L 27/144; H01L 27/14614; H01L 27/3287; H01L 31/12; H01L 31/1123
USPC .............. 257/43, 59, E29.296, E21.46, 9, 17; 438/104, 85, 86
See application file for complete search history.

(56) References Cited

U.S. PATENT DOCUMENTS 8,686,426 B2 * 4/2014 Ahn et al. .................. 257/72
8,822,988 B2 * 9/2014 Korthuis et al. ............. 257/43
(Continued)

FOREIGN PATENT DOCUMENTS

KR 10-2012-0037683 A 4/2012

OTHER PUBLICATIONS

A. Ohtomo et al., "A high-mobility electron gas at the LaAlO$_3$/SrTiO$_3$ heterointerface", Nature, Jan. 29, 2004, pp. 423-426, vol. 427, No. 29.
(Continued)

*Primary Examiner* — Thinh T Nguyen
(74) *Attorney, Agent, or Firm* — Rabin & Berdo, P.C.

(57) ABSTRACT

A transistor includes source/drain electrodes provided on a substrate; a semiconductor oxide layer provided between the source/drain electrodes; a gate electrode facing the semiconductor oxide layer; and a gate insulating layer interposed between the semiconductor oxide layer and the gate electrode, wherein the semiconductor oxide layer has a nano-layered structure including at least one first nano layer comprised of a first material and at least one second nano layer comprised of a second material that are alternatingly stacked one on another to provide at least one interface, and wherein the first material and the second material are different materials that are effective to form an electron transfer channel layer at the interface.

5 Claims, 3 Drawing Sheets

(56) References Cited

U.S. PATENT DOCUMENTS

2008/0171422 A1* 7/2008 Tokie et al. .................. 438/479
2012/0012840 A1* 1/2012 Korthuis et al. ............... 257/43
2012/0085999 A1* 4/2012 Song et al. .................... 257/43
2013/0256653 A1* 10/2013 Ahn et al. ..................... 257/43

OTHER PUBLICATIONS

J. Mannhart et al., "Two-Dimensional Electron Gases at Oxide Interfaces", Mrs Bulletin, Nov. 2008, pp. 1027-1034, vol. 33.

* cited by examiner

OXIDE TRANSISTOR WITH NANO-LAYERED STRUCTURE

CROSS-REFERENCE TO RELATED APPLICATIONS

This U.S. non-provisional patent application claims priority under 35 U.S.C. §119 to Korean Patent Application No. 10-2012-0144276, filed on Dec. 12, 2012, in the Korean Intellectual Property Office, the entire contents of which are hereby incorporated by reference.

BACKGROUND OF THE INVENTION

Example embodiments of the inventive concept relate to a transistor, and in particular, to an oxide semiconductor thin film transistor.

A variety of transistors are proposed to meet an increasing demand for small-sized electronic devices. For example, research on thin-film type transistors is actively being conducted.

To meet a demand for a next-generation display technology with large-area, high resolution, and high frame rate, a transistor is needed to have high electron mobility. Oxide semiconductor transistors provide technical advantages, such as high electron mobility and low temperature process compatibility, and thus, there is an increasing interest on the development of the oxide semiconductor transistor.

SUMMARY

Example embodiments of the inventive concept provide an oxide transistor, in which a nano-layered structure with high reliability is provided, and a method of fabricating the same.

According to example embodiments of the inventive concepts, a transistor may include source/drain electrodes on a substrate, a semiconductor oxide layer between the source/drain electrodes, a gate electrode facing the semiconductor oxide layer, and a gate insulating layer interposed between the semiconductor oxide layer and the gate electrode. The oxide semiconductor layer has a nano-layered structure including at least one first nano layer and at least one second nano layer.

In example embodiments, the second nano layer may be provided on the first nano layer and may include a material different from the first nano layer.

In example embodiments, the first nano layer and the second nano layer may be alternatingly stacked one on another.

In example embodiments, the first nano layer may include one selected from the group consisting of $BaTiO_3$, $SrTiO_3$, $BaSnO_3$, $ZnO$, $CuO$, $NiO$, $SnO_2$, $TiO_2$, $CoO$, $In_2O_3$, $WO_3$, $MgO$, $CaO$, $La_2O_3$, $Nd_2O_3$, $Y_2O_3$, $CeO_2$, $PbO$, $ZrO_2$, $Fe_2O_3$, $Bi_2O_3$, $V_2O_5$, $VO_2$, $Nb_2O_5$, $Co_3O_4$, and $Al_2O_3$, and the second nano layer may include one that is selected from the group consisting of $BaTiO_3$, $SrTiO_3$, $BaSnO_3$, $ZnO$, $CuO$, $NiO$, $SnO_2$, $TiO_2$, $CoO$, $In_2O_3$, $WO_3$, $MgO$, $CaO$, $La_2O_3$, $Nd_2O_3$, $Y_2O_3$, $CeO_2$, $PbO$, $ZrO_2$, $Fe_2O_3$, $Bi_2O_3$, $V_2O_5$, $VO_2$, $Nb_2O_5$, $Co_3O_4$ and $Al_2O_3$ and is different from the first nano layer.

In example embodiments, the oxide semiconductor layer may further include a third nano layer that is provided on the second nano layer to include a material different from the first and second nano layers.

In example embodiments, the first, second, and third nano layers may be alternatingly stacked.

In example embodiments, the oxide semiconductor layer has a thickness of about 1-100 nm.

According to example embodiments of the inventive concepts, a method of fabricating a transistor may include forming a first nano layer on a substrate, the first nano layer containing oxide semiconductor, forming a second nano layer on the first nano layer, the second nano layer containing a different material from the first nano layer, and forming source/drain electrodes, a gate insulating layer, and a gate electrode on the substrate.

In example embodiments, the method may further include forming a third nano layer on the second nano layer. The third nano layer may include a different material from the first and second nano layers.

In example embodiments, the first nano layer may include one selected from the group consisting of $BaTiO_3$, $SrTiO_3$, $BaSnO_3$, $ZnO$, $CuO$, $NiO$, $SnO_2$, $TiO_2$, $CoO$, $In_2O_3$, $WO_3$, $MgO$, $CaO$, $La_2O_3$, $Nd_2O_3$, $Y_2O_3$, $CeO_2$, $PbO$, $ZrO_2$, $Fe_2O_3$, $Bi_2O_3$, $V_2O_5$, $VO_2$, $Nb_2O_5$, $Co_3O_4$, and $Al_2O_3$, and the second nano layer may include one that is selected from the group consisting of $BaTiO_3$, $SrTiO_3$, $BaSnO_3$, $ZnO$, $CuO$, $NiO$, $SnO_2$, $TiO_2$, $CoO$, $In_2O_3$, $WO_3$, $MgO$, $CaO$, $La_2O_3$, $Nd_2O_3$, $Y_2O_3$, $CeO_2$, $PbO$, $ZrO_2$, $Fe_2O_3$, $Bi_2O_3$, $V_2O_5$, $VO_2$, $Nb_2O_5$, $Co_3O_4$ and $Al_2O_3$ and is different from the first nano layer.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

Figure 1:
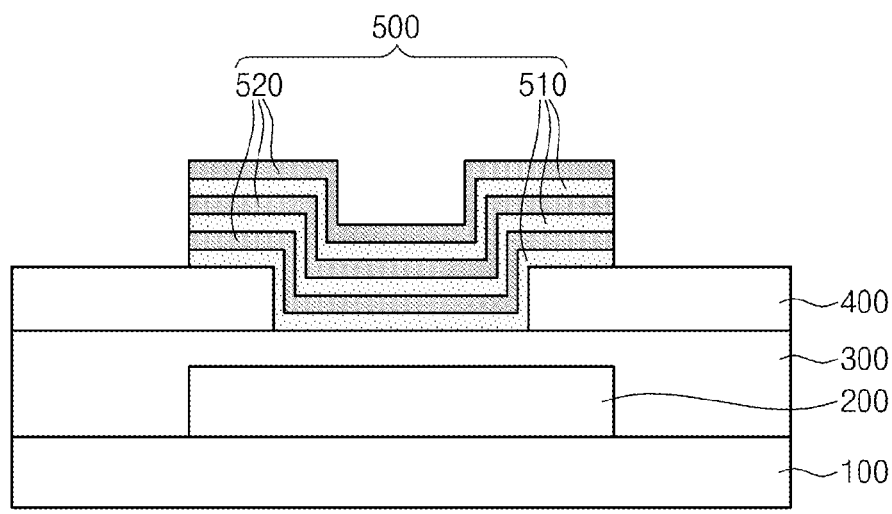
FIG. 1 is a sectional view illustrating a transistor according to example embodiments of the inventive concept.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a sectional view illustrating a transistor according to example embodiments of the inventive concept.

Referring to FIG. 1, a transistor 1 may include a gate electrode 200, a gate insulating layer 300, source/drain electrodes 400, and an oxide semiconductor layer 500 that are provided on a substrate 100.

The gate electrode 200 may be provided on the substrate 100. The substrate 100 may include at least one of silicon, glass, quartz, and/or polymer, and have a thickness of about 0.1-1 mm. The gate electrode 200 may include at least one selected from the group consisting of platinum (Pt), gold (Au), silver (Ag), aluminum (Al), nickel (Ni), titanium (Ti), copper (Cu), chromium (Cr), tungsten (W), molybdenum (Mo), and conductive oxides (e.g., ITO, IGO, and so forth).

The gate insulating layer 300 may be provided on the substrate 100 to cover the gate electrode 200. The gate insulating layer 300 may be provided between the gate electrode 200 and the oxide semiconductor layer 500. The gate insulating layer 300 may include at least one selected from the group consisting of oxide dielectrics (e.g., $Al_2$, $SiO_2$, $HfO_2$, $Ta_2O_5$, $ZrO_2$, $BaTiO_3$, $SrTiO_3$, and $BaSnO_3$).

The source/drain electrodes 400 may be formed on the gate insulating layer 300 to cover a portion of the gate insulating layer 300. The source/drain electrodes 400 may include at least one of the materials enumerated for the gate electrode 200.

The oxide semiconductor layer 500 may be formed on the gate insulating layer 300 to face the gate electrode 200. The oxide semiconductor layer 500 may be interposed between the source/drain electrodes 400, when viewed in plan view. The oxide semiconductor layer 500 may extend on the source/drain electrodes 400 and cover edge portions of the source/drain electrodes 400. The oxide semiconductor layer 500 may server as an active layer or a channel region of the transistor 1, when the transistor 1 is operated.

The oxide semiconductor layer 500 may include at least two materials selected from the group consisting of $BaTiO_3$, $SrTiO_3$, $BaSnO_3$, $ZnO$, $CuO$, $NiO$, $SnO_2$, $TiO_2$, $CoO$, $In_2O_3$, $WO_3$, $MgO$, $CaO$, $La_2O_3$, $Nd_2O_3$, $Y_2O_3$, $CeO_2$, $PbO$, $ZrO_2$, $Fe_2O_3$, $Bi_2O_3$, $V_2O_5$, $VO_2$, $Nb_2O_5$, $Co_3O_4$, and $Al_2O_3$. The oxide semiconductor layer 500 may be configured to have a nano-layered structure. The nano-layered structure may refer to a multi-layered structure including two or more layers, each of which has a nano-sized thickness. For example, the oxide semiconductor layer 500 may include at least one first nano layer 510 and at least one second nano layer 520. The oxide semiconductor layer 500 may have a thickness of about 1 nm to about 100 nm. Each of the first nano layer 510 and the second nano layer 520 may have a thickness of about 0.1 nm to about 10 nm. The second nano layer 520 may be provided on the first nano layer 510, and the first and second nano layers 510 and 520 may be stacked alternatingly. In other example embodiments, the first and second nano layers 510 and 520 may be stacked with a random sequence. The second nano layer 520 may include a different material from that of the first nano layer 510. For example, the first nano layer 510 may include at least one of the materials enumerated for the oxide semiconductor layer 500, and the second nano layer 520 may include a material different from the materials enumerated for the oxide semiconductor layer 500. In the case where the first and second nano layers 510 and 520 include different materials from each other, a dangling bond and/or incomplete atom coordination may be provided at an interface between the first and second nano layers 510 and 520. Accordingly, an electron transfer channel layer may be formed at the interface between the first and second nano layers 510 and 520, and thus, the transistor may have high electron mobility. In example embodiments, the oxide semiconductor layer 500 may include InZNo. In the case where the oxide semiconductor layer 500 includes a structure of InZnO that is provided by stacking alternatingly the first nano layer 510 of $In_2O_3$ and the second nano layer 520 of ZnO, its electron mobility may be higher than that of a single-layered InZnO structure. Accordingly, the transistor 1 can have higher reliability.

Figure 2:
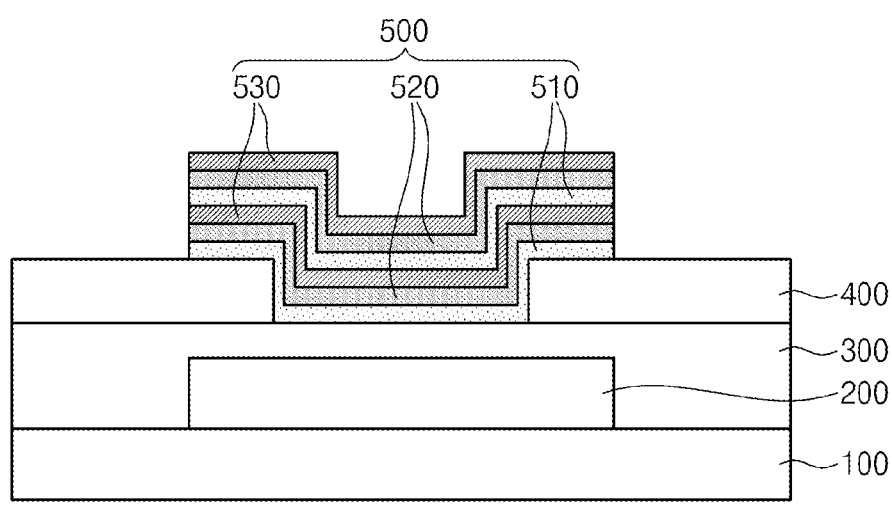
FIG. 2 is a sectional view illustrating a transistor according to other example embodiments of the inventive concept.

FIG. 2 is a sectional view illustrating a transistor according to other example embodiments of the inventive concept. For concise description, overlapping description of elements previously described with reference to FIG. 1 may be omitted.

Referring to FIG. 2, a transistor 2 may include a gate electrode 200, a gate insulating layer 300, source/drain electrodes 400, and an oxide semiconductor layer 500 that are provided on a substrate 100. The gate electrode 200, the gate insulating layer 300, and the source/drain electrodes 400 may be configured to have the same technical features as those described with reference to FIG. 1.

The oxide semiconductor layer 500 may be formed on the gate insulating layer 300 to face the gate electrode 200. The oxide semiconductor layer 500 may have a nano-layered structure. The oxide semiconductor layer 500 may include at least one first nano layer 510, at least one second nano layer 520, and at least one third nano layer 530. The second nano layer 520 and the third nano layer 530 may be sequentially stacked on the first nano layer 510. In example embodiments, the oxide semiconductor layer 500 may include the first, second, and third nano layers 510, 520, and 530 that are alternatingly stacked one on another. In other embodiments, the first, second, and third nano layers 510, 520, and 530 may be stacked in a random manner, but example embodiments of the inventive concepts may not be limited thereto. The third nano layer 530 may include a material different from at least one of the first nano layer 510 and the second nano layer 520. For example, third nano layer 530 may include at least one selected from the group consisting of $BaTiO_3$, $SrTiO_3$, $BaSnO_3$, ZnO, CuO, NiO, $SnO_2$, $TiO_2$, CoO, $In_2O_3$, $WO_3$, MgO, CaO, $La_2O_3$, $Nd_2O_3$, $Y_2O_3$, $CeO_2$, PbO, $ZrO_2$, $Fe_2O_3$, $Bi_2O_3$, $V_2O_5$, $VO_2$, $Nb_2O_5$, $CO_3O_4$, and $Al_2O_3$. The oxide semiconductor layer 500 may have a thickness of about 1-100 nm. Each of the first, second, and third nano layers 510, 520, and 530 may have a thickness of about 0.1-10 nm. A dangling bond and/or incomplete atom coordination may be provided at interfaces between the first and second nano layers 510 and 520, between the second and third nano layers 520 and 530, and/or between the first and third nano layers 510 and 530, and thus, the oxide semiconductor layer 500 can be used to realize a channel with high charge mobility.

Figure 3:
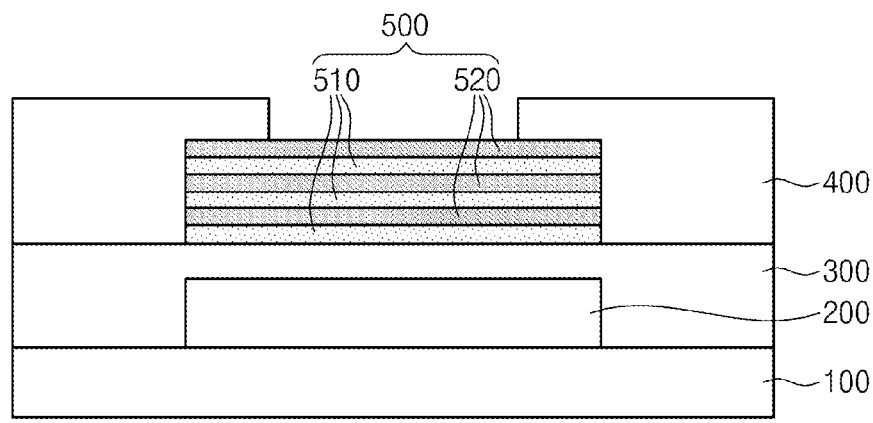
FIG. 3 is a sectional view illustrating a transistor according to still other example embodiments of the inventive concept.

FIG. 3 is a sectional view illustrating a transistor according to still other example embodiments of the inventive concept. For concise description, overlapping description of elements previously described with reference to FIGS. 1 and 2 may be omitted.

Referring to FIG. 3, a transistor 3 may include a gate electrode 200, a gate insulating layer 300, source/drain electrodes 400, and an oxide semiconductor layer 500 that are provided on a substrate 100. The substrate 100, the gate electrode 200, and the gate insulating layer 300 may be configured to have the same technical features as those described with reference to FIG. 1. By contrast, the source/drain electrodes 400 and the oxide semiconductor layer 500 may be configured to have technical features different from those of FIG. 1.

The oxide semiconductor layer 500 may be provided on the gate insulating layer 300 and be partially covered with the source/drain electrodes 400. The oxide semiconductor layer 500 may have a nano-layered structure. The oxide semiconductor layer 500 may include at least one first nano layer 510 and at least one second nano layer 520. The first nano layer 510 and the second nano layer 520 may be configured to have substantially the same technical features as those described with reference to FIG. 1. The oxide semiconductor layer 500 may further include the third nano layer 530 described with reference to FIG. 2, but example embodiments of the inventive concepts may not be limited thereto. The source/drain electrodes 400 may be provided on the gate insulating layer 300. The source/drain electrodes 400 may extend to cover a top edge of the oxide semiconductor layer 500.

Figure 4:
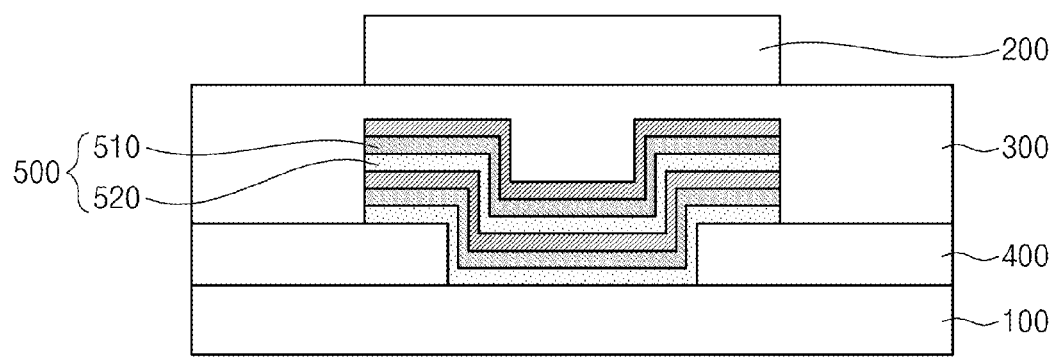
FIG. 4 is a sectional view illustrating a transistor according to even other example embodiments of the inventive concept.

FIG. 4 is a sectional view illustrating a transistor according to even other example embodiments of the inventive concept.

Referring to FIG. 4, a transistor 4 may include an oxide semiconductor layer 500, source/drain electrodes 400, a gate insulating layer 300, and a gate electrode 200 that are provided on a substrate 100.

Referring to FIG. 4, the source/drain electrodes 400 may be provided on the substrate 100 to cover a portion of the substrate 100. The oxide semiconductor layer 500 may be provided between the source/drain electrodes 400 on the substrate 100. The oxide semiconductor layer 500 may be formed to be in contact with the source/drain electrodes 400 and extend to top surfaces of the source/drain electrodes 400. The oxide semiconductor layer 500 may have a nano-layered structure. The oxide semiconductor layer 500 may include at least one first nano layer 510 and at least one second nano layer 520. The first nano layer 510 and the second nano layer 520 may be configured to have substantially the same technical features as those described with reference to FIG. 1. The oxide semiconductor layer 500 may further include the third nano layer 530 described with reference to FIG. 2, but example embodiments of the inventive concepts may not be limited thereto. The gate insulating layer 300 may be interposed between the oxide semiconductor layer 500 and the gate electrode 200. The gate insulating layer 300 may cover the oxide semiconductor layer 500. The gate electrode 200 may be provided on the gate insulating layer 300 to face the oxide semiconductor layer 500.

Figure 5:
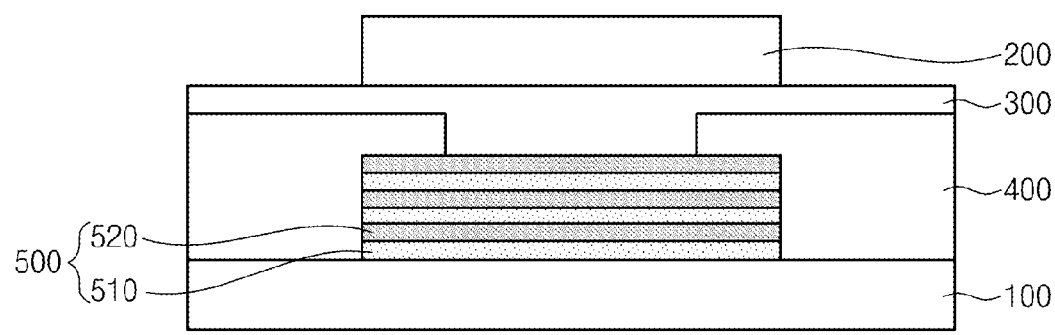
FIG. 5 is a sectional view illustrating a transistor according to yet other example embodiments of the inventive concept.

FIG. 5 is a sectional view illustrating a transistor according to yet other example embodiments of the inventive concept.

Referring to FIG. 5, a transistor 5 may include an oxide semiconductor layer 500, source/drain electrodes 400, a gate insulating layer 300, and a gate electrode 200 that are provided on a substrate 100. The substrate 100, the gate electrode 200 and gate insulating layer 300 may be configured to have the same technical features as those described with reference to FIG. 4. By contrast, the source/drain electrodes 400 and the oxide semiconductor layer 500 may be configured to have technical features different from those of FIG. 4.

The oxide semiconductor layer 500 may be provided on the substrate 100 to cover a portion of the substrate 100. A portion of the oxide semiconductor layer 500 may be covered with the source/drain electrodes 400. The oxide semiconductor layer 500 may have a nano-layered structure. The oxide semiconductor layer 500 may include at least one first nano layer 510 and at least one second nano layer 520. The first nano layer 510 and the second nano layer 520 may be configured to have substantially the same technical features as those described with reference to FIG. 1. The first and second nano layers 510 and 520 may be alternatingly stacked one on another, but example embodiments of the inventive concepts may not be limited thereto. The oxide semiconductor layer 500 may further include the third nano layer (not shown) described with reference to FIG. 2. The source/drain electrodes 400 may be formed to cover a portion of the substrate 100. The source/drain electrodes 400 may extend to cover a top edge of the oxide semiconductor layer 500.

Hereinafter, a method of fabricating a transistor according to example embodiments of the inventive concept will be described with reference to the accompanying drawings.

Referring back to FIG. 1, an oxide semiconductor layer 500 may be formed on a substrate 100. The substrate 100 may be provided to include the gate electrode 200, the gate insulating layer 300, and the source/drain electrodes 400, as described with reference to FIG. 1. A first nano layer 510 may be formed by depositing a material, which may be one of the enumerated materials previously described with reference to FIG. 1, on the substrate 100. In example embodiments, the first nano layer 510 may be formed to have a thickness of about 0.1-10 nm. In example embodiments, the first nano layer 510 may be formed by a pulsed laser deposition, a sputtering process, an atomic layer deposition (ALD), or a sol-gel process. A second nano layer 520 may be formed by depositing at least one of the materials previously described with reference to FIG. 1 on the first nano layer 510 to have a thickness of about 0.1-10 nm. For example, the second nano layer 520 may be formed of at least one selected from the group consisting of $BaTiO_3$, $SrTiO_3$, $BaSnO_3$, ZnO, CuO, NiO, $SnO_2$, $TiO_2$, CoO, $In_2O_3$, $WO_3$, MgO, CaO, $La_2O_3$, $Nd_2O_3$, $Y_2O_3$, $CeO_2$, PbO, $ZrO_2$, $Fe_2O_3$, $Bi_2O_3$, $V_2O_5$, $VO_2$, $Nb_2O_5$, $Co_3O_4$, and $Al_2O_3$. The second nano layer 520 may be formed by depositing a different material from the first nano layer 510. The second nano layer 520 may be formed by one of a pulsed laser deposition, a sputtering process, an atomic layer deposition (ALD), or a sol-gel process. The first nano layer 510 and the second nano layer 520 may be repeatedly deposited. Thereafter, the first nano layer 510 and the second nano layer 520 may be patterned to form the oxide semiconductor layer 500. As a result, fabrication of the transistor 1 may be completed.

A process of fabricating a transistor according to an experimental example and electric characteristics of the transistor will be described below.

Fabrication of Transistor

EXPERIMENTAL EXAMPLE a. Forming an Oxide Semiconductor Layer

ZnSnO oxide semiconductor layer having a nano-layered structure may be formed using a pulsed laser deposition. By performing a pulsed laser deposition using ZnO target, a ZnO layer may be deposited to have a thickness of 0.8 nm By performing a pulsed laser deposition using $SnO_2$ target on the ZnO layer, a $SnO_2$ layer may be deposited to have a thickness of 0.8 nm. A nano-layered structure may be formed by performing alternatingly and repeatedly the steps of forming the ZnO and $SnO_2$ layers. For example, the ZnO and $SnO_2$ layers may be alternatingly and repeatedly stacked to form a nano-layered structure including 20 nano layers. As a result, a ZnSnO oxide semiconductor layer having a nano-layered structure may be formed. In example embodiments, the ZnSnO oxide semiconductor layer may be formed to have a thickness of about 32 nm.

b. Forming a Transistor

A glass substrate with an oxide semiconductor layer was provided. The oxide semiconductor layer may be the ZnSnO oxide semiconductor layer with the nano-layered structure. A gate electrode (e.g., ITO), a gate insulating layer (e.g., $Al_2O_3$), and source/drain electrodes (e.g., ITO) may be formed on the glass substrate to manufacture a transistor 5, whose structure is shaped like that shown in FIG. 5.

Result—Electric Characteristics of the Transistor

Figure 6:
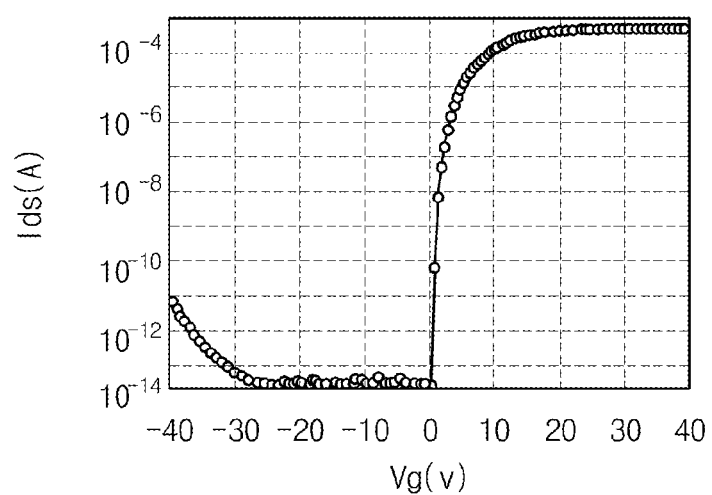
FIG. 6 is a graph showing a transmission property of a transistor according to an experimental example.

FIG. 6 is a graph showing a transmission property of the transistor, which was fabricated to include a nano-layered thin film of ZnSnO, according to the experimental example. To evaluate the transmission property of the transistor, drain current (Ids) versus gate voltage (Vg) was measured under a drain voltage (Vd) of 15V. The transistor of FIG. 5 was used for the measurement of FIG. 6.

Referring to FIG. 6, the transistor according to the experimental example had a saturated electron mobility ($m_{sat}$) of 16.4 $cm^2/Vs$, an on-off ratio, $I_{on}/I_{off}$, of $10^8$ or more, and a subthreshold swing, ss, of 0.25 V/dec or less. The transistor was configured to include the first and second nano layers 510 and 520 that are formed of different materials from each other, and thus, electron mobility may be increased at an interface between the first and second nano layers 510 and 520. Accordingly, the transistor according to the experimental example may have a good transmission property.

According to example embodiments of the inventive concept, provided is a transistor with a nano-layered oxide semiconductor layer. The oxide semiconductor layer may include at least one first nano layer and at least one second nano layer. Here, the first nano layer and the second nano layer may have different materials from each other, and thus, a dangling bond and/or incomplete atom coordination may be provided at an interface between the first and second nano layers. This makes it possible to realize a channel that is formed at the interface between the first and second nano layers to have high electron mobility. Accordingly, the transistor can have high reliability.

While example embodiments of the inventive concepts have been particularly shown and described, it will be understood by one of ordinary skill in the art that variations in form and detail may be made therein without departing from the spirit and scope of the attached claims.

What is claimed is:
1. A transistor, comprising:
   source/drain electrodes provided on a substrate;
   a semiconductor oxide layer provided between the source/drain electrodes;
   a gate electrode facing the semiconductor oxide layer; and
   a gate insulating layer interposed between the semiconductor oxide layer and the gate electrode,
   wherein the semiconductor oxide layer has a nano-layered structure including at least one first nano layer comprised of a first material and at least one second nano layer comprised of a second material that are alternatingly stacked one on another to provide at least one interface, wherein the first material and the second material are different materials that are effective to form an electron transfer channel layer at the interface, and wherein the at least one first nano layer and the at least one second nano layer have an interface there between which interface has at least one of a dangling bond and an incomplete atom coordination.

2. The transistor of claim 1, wherein the first material is selected from the group consisting of $BaTiO_3$, $SrTiO_3$, $BaSnO_3$, $ZnO$, $CuO$, $NiO$, $SnO_2$, $TiO_2$, $CoO$, $In_2O_3$, $WO_3$, $MgO$, $CaO$, $La_2O_3$, $Nd_2O_3$, $Y_2O_3$, $CeO_2$, $PbO$, $ZrO_2$, $Fe_2O_3$, $Bi_2O_3$, $V_2O_5$, $VO_2$, $Nb_2O_5$, $Co_3O_4$, and $Al_2O_3$, and the second material is selected from the group consisting of $BaTiO_3$, $SrTiO_3$, $BaSnO_3$, $ZnO$, $CuO$, $NiO$, $SnO_2$, $TiO_2$, $CoO$, $In_2O_3$, $WO_3$, $MgO$, $CaO$, $La_2O_3$, $Nd_2O_3$, $Y_2O_3$, $CeO_2$, $PbO$, $ZrO_2$, $Fe_2O_3$, $Bi_2O_3$, $V_2O_5$, $VO_2$, $Nb_2O_5$, $Co_3O_4$ and $Al_2O_3$, and is different from the first material.

3. The transistor of claim 1, wherein the semiconductor oxide layer further comprises a third nano layer that is provided on the second nano layer and that is comprised of a third material that is different from the first and second materials.

4. The transistor of claim 3, wherein the first, second, and third nano layers are alternatingly stacked.

5. The transistor of claim 1, wherein the semiconductor oxide layer has a thickness of about 1-100 nm.

* * * * *